(12) United States Patent  
Omnes et al.

(10) Patent No.: US 9,287,517 B2  
(45) Date of Patent: Mar. 15, 2016

(54) FUNCTIONALIZATION OF SP³ HYBRIDIZED CARBON, SILICON AND/OR GERMANIUM SURFACES

(75) Inventors: Franck Jacques Omnes, Saint Laurent du Pont (FR); Charles Agnes, Grenoble (FR); Sebastien Ruffinatto, Grenoble (FR); Pascal Mailley, Le Pin (FR)

(73) Assignee: CENTRE NATIONAL DE LA RECHERCHE SCIENTIFIQUE (C.N.R.S.), Paris (FR)

( * ) Notice: Subject to any disclaimer, the term of this patent is extended or adjusted under 35 U.S.C. 154(b) by 1082 days.

(21) Appl. No.: 13/381,890

(22) PCT Filed: Jul. 2, 2010

(86) PCT No.: PCT/FR2010/051399  
§ 371 (c)(1),  
(2), (4) Date: Mar. 22, 2012

(87) PCT Pub. No.: WO2011/001123  
PCT Pub. Date: Jan. 6, 2011

(65) Prior Publication Data  
US 2012/0177894 A1 Jul. 12, 2012

(30) Foreign Application Priority Data  
Jul. 2, 2009 (FR) ..................... 09 54542

(51) Int. Cl.  
| B32B 3/10 | (2006.01) |
| H01L 51/05 | (2006.01) |
| G03F 7/00 | (2006.01) |
| B82Y 10/00 | (2011.01) |
| B82Y 40/00 | (2011.01) |

(52) U.S. Cl.  
CPC ............ *H01L 51/0595* (2013.01); *B82Y 10/00* (2013.01); *B82Y 40/00* (2013.01); *G03F 7/0002* (2013.01); *Y10T 428/24802* (2015.01)

(58) Field of Classification Search  
CPC .................................................. G03F 7/0002  
See application file for complete search history.

(56) References Cited

FOREIGN PATENT DOCUMENTS

| JP | 2001-139532 | 5/2001 |
| JP | 2003-125764 | 5/2003 |
| JP | 2009-049752 | 3/2009 |
| JP | 2009-091168 | 4/2009 |
| WO | 99/40173 | 8/1999 |
| WO | 2005/116306 | 12/2005 |

OTHER PUBLICATIONS

Andreas Hartl Protein-modified nanocrystalline diamond thin films for biosensor applications 2004.*

(Continued)

*Primary Examiner* — David Sample  
*Assistant Examiner* — Christopher Polley  
(74) *Attorney, Agent, or Firm* — ALG Intellectual Property, LLC

(57) ABSTRACT

The invention concerns a method for preparing a grafted material comprising the following steps:
  a) providing a material which, on its surface, comprises sp³ hybridized carbon, silicon and/or germanium atoms carrying at least one hydrogen atom, and
  b) contacting in a solvent the material such as provided at step a) with a compound (C) carrying at least one amine function in the unprotonated state, whereby the said compound (C) is grafted onto the said material.

18 Claims, 5 Drawing Sheets

(56) References Cited

OTHER PUBLICATIONS

Pascal Mailley New one step functionalization of polycrystalline diamond films using amine derivates Materials Science and Engineering Conference 16 2010.*

Publication showing the date of the Materials Science and Engineering Conference 16 to be Jun. 7-11.*

Yang et al.,Characterization of Direct Immobilized Probe DNA on Partially Functionalized Diamond Solution-Gate Field-Effect Transistors, Japanese Journal of Applied Physics, published Oct. 20, 2006, pp. L1114-L1117, vol. 45 No. 42, The Japan Society of Applied Physics, Japan.

Coffinier et al., Peptide Immobilization on Amine-Terminated Boron-Doped Diamond Surfaces, Langmuir, 2007, pp. 4494-4497, vol. 23. No. 8, American Chemical Society, Published on Web Mar. 17, 2007.

Tian et al., Construction of Two-Dimensional Arrays Gold Nanoparticles Monolayer onto Boron-Doped Diamond Electrode Surfaces, Chem. Mater., 2006, pp. 939-945, vol. 18 No. 4, American Chemical Society, Published on Web Jan. 28, 2006.

Szunerits et al., Different strategies for functionalization of diamond surfaces, J Solid State Electrochem, 2008, pp. 1205-1218, vol. 12, Published online Dec. 4, 2007 copyright Springer-Verlag.

Strother et al., Photochemical Functionalization of Diamond Films, Langmuir, 2002, pp. 968-971, vol. 18, No. 4 American Chemical Society, Published on Web Jan. 18, 2002.

* cited by examiner

SEQUENCE LISTING

```
<160> NUMBER OF SEQ ID NOS: 2

<210> SEQ ID NO 1
<211> LENGTH: 29
<212> TYPE: DNA
<213> ORGANISM: Artificial Sequence
<220> FEATURE:
<223> OTHER INFORMATION: probe
<220> FEATURE:
<221> NAME/KEY: misc_feature
<222> LOCATION: (1)..(1)
<223> OTHER INFORMATION: n = NH2-(CH2)6-T

<400> SEQUENCE: 1
nttttgacca tcgtgcgggt aggtagacc                                    29

<210> SEQ ID NO 2
<211> LENGTH: 29
<212> TYPE: DNA
<213> ORGANISM: Artificial Sequence
<220> FEATURE:
<223> OTHER INFORMATION: probe
<220> FEATURE:
<221> NAME/KEY: misc_feature
<222> LOCATION: (1)..(1)
<223> OTHER INFORMATION: n = NH2-(CH2)6-T

<400> SEQUENCE: 2
nttttgaccg gtatgcgacc tggtatgcg                                    29
```

FUNCTIONALIZATION OF SP³ HYBRIDIZED CARBON, SILICON AND/OR GERMANIUM SURFACES

The present invention concerns a novel method for functionalizing materials whose surface comprises carbon, silicon and/or germanium, allowing the grafting of compounds via strong bonding onto the surface of these materials.

The surface functionalization of materials has numerous applications, in particular in the fields of bioelectronics for example (biosensors, biochips, biomedical) and molecular electronics in which the grafting of compounds on the surface of conductor or semiconductor materials particularly allows the modulating of their properties: chemical and biochemical sensitivity, interaction with the environment, photosensitivity, electric and/or electrochemical exchange properties, tribology . . . . In this respect, it is of interest to functionalize semiconductor materials of semi-conductive or metallic nature containing carbon, in particular diamond, silicon and/or germanium.

The literature reports on various methods for grafting compounds onto materials whose surface comprises carbon, silicon or germanium.

Silicon and germanium, which generally behaves in the same manner as silicon, are the subject of intense research in terms of functionalization (Buriak, Chem. Rev. 102(5), 1271-1308, 2002). Among the methods for functionalizing materials whose surface comprises silicon mention may be made of: silanisation, hydrosylilation, electrochemistry and the grafting of nucleophilic molecules onto reconstructed silicon.

Reconstructed silicon is silicon whose surface crystalline structure has been modified under ultra-vacuum conditions (typically $10^{-10}$ bar) and high temperatures (typically higher than 800K). This leads to desorption of the native oxide and recombination of the adjacent dangling bonds to form, on the surface and in ordered manner, double bonds of Si=Si type: the surface silicon atoms of the reconstructed silicon in this particular situation have a coordination structure of $sp^2$ type. The surface thus reconstructed can easily be hydrogenated by a vacuum process. Any type of nucleophilic compound carrying a non-bonding or unsaturated doublet can be grafted by dative binding onto the surface of hydrogenated reconstructed silicon, respectively by nucleophilic substitution or by cycloaddition (Leftwich et al., Surface Science Reports 63, 1-71, 2008). However, this grafting pathway has numerous disadvantages:

- the preparation of hydrogenated reconstructed silicon is very complex and costly;
- the hydrogenated or non-hydrogenated reconstructed silicon is only stable in an inert atmosphere (the surface oxidizes in the presence of water and/or oxygen);
- the grafting of molecules cannot be localized to a local selected region of the surface (the entirety of the surface is necessarily grafted or zones can be grafted locally, but localization is attributable to the morphology of the substrate and not to operator choice), and
- the grafting process is long: several hours' incubation are necessary.

In addition, methods for functionalizing materials whose surface comprises diamond have been developed, in particular:

- methods for functionalizing surface-oxidized diamond either from carbonyls (C=O) present on the diamond surface (Notsu et al., Journal of Electroanalytical Chemistry, 493, 31, 2000), or from hydroxyl groups (C—OH) present on the diamond surface (Notsu et al., Electrochimical and Solid State Letters 4, H1, 2001—Delabouglise et al., Chemical Communications 2698, 2003—Mazur et al., Langmuir, 21, 8802, 2005),
- methods for functionalizing diamond by the formation of carbon-carbon bonds:

The absorption of UV light in the hydrogenated diamond generates electron-hole pairs in the volume of the material, and the excess positive charge resulting from the photogenerated holes migrating to the surface forms a target for nucleophilic attack by the alkenes (Yang et al., Nature Materials 1, 253-257, 2002).

Electrochemistry is an alternative method. Diamond heavily doped with boron is used as electrode and diazonium salts, which form radicals by reduction, react with the surface of the diamond to form carbon-carbon bonds (Kuo et al., Electrochemical and Solid State Letters 2, 288, 1999 and Delamar et al., Journal of the American Chemical Society 114, 5883, 1992).

- methods for functionalizing surface-halogenated diamond:

The surface of the diamond can also be halogenated (fluorination, chlorination). The surface halogens can then react with other functional molecules, for example the surface can be aminated (Ohtani et al., Chemistry Letters, 953, 1998).

One of the current challenges for grafting molecules onto the surface of semiconductors is to perform grafting in localized manner, on only part of the surface, which is an advantage for numerous applications (preparation of organic electronic devices or biochips for example).

Electrochemistry is the current method of choice for forming a deposit of molecules in localized manner. For example, Livache et al. (Journal of Pharmaceutical and Biomedical Analysis 32, 687, 2003) report on localized grafting by <<electrospotting>> on gold. However, this methodology requires metallic behaviour of the support material. This means that only germanium, silicon carbide, diamond and silicon that are heavily doped (>$3.10^{20}$ $B.cm^{-3}$ for diamond and >$10^{18}$ $B.cm^{-3}$ for silicon) can be functionalized by these means. This grafting method cannot therefore be generalized to all types of germanium, silicon carbide, silicon or diamond.

There are also reports in the literature of the electrochemical grafting of molecules carrying an amine function onto carbon of glassy or graphite type, in which the carbon atoms are $sp^2$ hybridized. More precisely, under these conditions, the amine function is oxidized to form a radical which then reacts with the glassy carbon or graphite, allowing the grafting of these molecules (Deinhammer et al., Langmuir 10, 1306-1313, 1994). This method has the advantage of being rapid, allowing the grafting of molecules onto surfaces in localized manner. However, the electrochemical activation of amine functions requires a very high potential which may generate irreversible degradation of the own functions of the grafted molecule (functions of recognition, electron transport, catalysis . . . ).

One objective of the present invention is to provide a novel method which gives access to grafted materials, in particular grafted semiconductor materials, with the possibility of performing the grafting in localized manner.

For this purpose, according to a first aspect, the invention provides a method for preparing a grafted material comprising the following steps:

a) providing a material whose surface comprises $sp^3$ hybridized carbon, silicon and/or germanium atoms carrying at least one hydrogen atom, and b) contacting the material such as provided at step a) with a compound (C) carrying at least one amine function in the unprotonated state, whereby the said compound (C) is grafted onto the said material.

In one embodiment, step b) of the method is performed in the presence of oxygen.

The work carried out by the inventors for the present invention allowed the evidencing that the presence of oxygen generally promotes the grafting of the compounds (C).

In one embodiment, step b) of the method is conducted in a solvent. The solvent may be a solvent or a mixture of several solvents. According to one embodiment, the solvent(s) used for step b) may be of protic type. According to another embodiment, the solvent (s) used for step b) may be of aprotic type. Preferably compound (C) is at least partly soluble in the solvent, typically the compound (C) is in the solubilised state in the solvent. When step b) is performed in a solvent, step b) may consist in particular of dip coating the material such as provided at step a) in the said solvent, in particular when it is desired to graft compound (C) over the entirety of the surface of the material.

By protic solvent is meant a solvent which comprises at least one hydrogen atom able to be released in proton form. A protic solvent is advantageously chosen from the group comprising water, deionised water, distilled water, preferably basified, hydroxylated solvents such as methanol and ethanol.

By aprotic solvent is meant any solvent which is not protic, namely which is not able to release or to accept a proton. An aprotic solvent is advantageously dimethylsulfoxyde (DMSO) or acetone.

The solvent used at step b) may comprise a pH regulating agent which allows the amine function of the compound (C) to be in the unprotonated state. This pH regulating agent is preferably soluble in the solvent. For example when the solvent is DMSO, it is preferably saturated with a Brönsted base such as potassium hydroxide.

Preferably when step b) is performed in a solvent, the concentration of compound (C) in the solvent is 10 nM to 1M, in particular 100 nM to 100 mM, more particularly 1 mM to 10 mM.

In one embodiment, step b) of the method is conducted in the presence of water.

In one preferred embodiment, step b) of the method is performed in the presence of oxygen and water.

The grafting of compounds (C) is facilitated when the oxygen and water are present in the reaction medium.

The inventors have surprisingly discovered that the implementing of steps a) and b) allows the grafting of compounds (C) carrying at least one amine function onto the surface of a material whose surface comprises atoms of at least one of the elements carbon, silicon or germanium (non-metal elements in Group IV of the periodic table) in the $sp^3$ hybridization state and carrying at least one hydrogen atom.

The method has the advantage of allowing the grafting of compounds (C) carrying at least one amine function onto the surface of a material without supplying external energy (without irradiation, plasma, thermal energy . . . ).

The method of the invention has the advantage of being applicable to any material whose surface comprises hydrogenated silicon, germanium and/or diamond. Preferably, the materials have a surface which comprises diamond, silicon, germanium and/or silicon carbide. In the materials used in the method of the invention, the carbon, silicon and/or germanium are generally crystalline. The silicon, germanium, carbon and/or silicon carbide used may be in mono- or polycrystalline form. In addition, the silicon, diamond, germanium and silicon carbide, whether or not doped, may therefore be insulating, semi-conductive or conductive. The method is independent of the electric conductivity of the silicon, germanium, carbon and/or silicon carbide used which is of notable advantage compared with the electrochemical grafting method.

The other elements in Group IV (metal elements: tin and lead) are not adapted. The hydrogen-metal bonds such as Sn—H or Pb—H are extremely unstable and appear to be incompatible with implementation of the methodology described herein.

At step a), a material is provided whose surface comprises atoms of at least one of the elements carbon, silicon and/or germanium and carrying at least one hydrogen atom. The surface of this material therefore comprises surface hydrogen atoms linked by C—H, Si—H and/or Ge—H bonds. Depending upon the desired type of grafting, all or part of these surface atoms of carbon, silicon and/or germanium carries hydrogen atoms. According to one particular embodiment, essentially all the carbon, silicon and/or germanium surface atoms are hydrogenated (typically at least 95% are hydrogenated).

The material provided at step a) on its surface comprises $sp^3$ hybridized carbon, silicon and/or germanium atoms i.e. each of these surface atoms is bonded to four neighbouring atoms via sigma bonds, having no double or multiple bond with a neighbouring atom. The $sp^3$ hybridized carbon is chiefly diamond but may be formed of silicon carbide.

All or part of these $sp^3$ hybridized surface atoms is hydrogenated. Preferably, at least 95% of the carbon, silicon and/or germanium surface atoms are in the $sp^3$ hybridization state. According to one particular embodiment, all the carbon, silicon and/or germanium surface atoms are in the $sp^3$ hybridization state and the surface of the material is devoid of carbon, silicon and/germanium surface atoms in the $sp^2$ hybridization state. In particular, the material of the invention does not generally comprise and is not generally reconstructed silicon, diamond or germanium, DLC (diamond like carbon), graphite or glassy carbon.

In one preferred embodiment of the method, the material comprises a least one surface layer formed of one of the elements chosen from among carbon, silicon, germanium and mixtures thereof.

Preferably, the material comprises at least one surface layer formed of diamond, silicon or silicon carbide.

The material may also be formed of one of the elements selected from among carbon, silicon, germanium and mixtures thereof. The material may in particular be formed of diamond, silicon or silicon carbide.

In one embodiment of the method, the material on its surface comprises synthetic diamond, preferably freshly prepared, for example when it leaves the growth apparatus in a vapour deposit growth method (CVD).

<<Synthetic diamond>> corresponds to a diamond manufactured by man, unlike natural diamond. It may be manufactured using High Pressure High Temperature (HPHT) growth methods or Chemical Vapour Deposit (CVD) growth techniques. The CVD synthesis processes give rise to essentially hydrogenated surfaces. On the other hand, HPHT diamond is not necessarily obtained in hydrogenated form on completion of synthesis.

In one embodiment, the material provided at step a) is derived from a hydrogenation step of an initial material whose surface comprises $sp^3$ hybridized carbon, silicon and/or germanium atoms, initially non-hydrogenated or not fully hydrogenated.

In this embodiment, the surface of the material is not initially hydrogenated or is only partly hydrogenated. The surface of the material is first hydrogenated before grafting compound (C) carrying an amine function.

By <<hydrogenation>> it is meant the physicochemical reaction whereby [carbon, germanium or silicon]-hydrogen bonds are set up. Hydrogenation can be performed using any method known to persons skilled in the art. Amongst these, particular mention may be made of diamond hydrogenation by $H_2$ plasma (L. Ley, R. Graupner, J. B. Cui, and J. Ristein, Carbon 37, 793, 1999) or silicon hydrogenation via hydrofluoric acid treatment.

In one particular embodiment of the method, the material provided at step a) is derived from a hydrogenation step, using $H_2$ plasma, of an initial material whose surface comprises diamond, silicon or germanium, initially non-hydrogenated or partly non-hydrogenated. Preferably, hydrogenation of the diamond with $H_2$ plasma is performed by microwave plasma. In this embodiment, the diamond can in particular be a non-hydrogenated or partly hydrogenated diamond obtained using High Pressure-High Temperature (HPHT) growth processes.

It is to be noted that hydrogenation of the diamond (on leaving the growth apparatus or after hydrogenation by $H_2$ plasma) is long-lasting even if ageing in air leads to partial loss of the surface carbon-hydrogen functions, typically 15% after one week's exposure to air (Vanhove et al., PSSA, 204 (9), 2931-2939, 2007). This gives rise to the onset of surface groups of carboxyl (COON), carbonyl (C=O), hydroxyl (C—OH) type, ether bridges (C—O—C). The method has the advantage that it can be applied both to diamond just after hydrogenation and to aged diamond.

In another particular embodiment of the method, the material provided at step a) is derived from a hydrogenation step by treatment with hydrofluoric acid of an initial material whose surface comprise silicon or germanium initially non-hydrogenated or partly non-hydrogenated.

The surface of the silicon is coated with a layer of native silica which develops spontaneously. When this surface is treated with hydrofluoric acid, the silica dissolves, allowing hydrogenated silicon to be obtained.

In general, it is preferable to conduct step b) as early as possible after hydrogenation of the silicon surface. Hydrogenated silicon is effectively subject to a passivation phenomenon, and the grafting of compound (C) using the method of the invention therefore competes with passivation.

At step b), compounds (C) are provided carrying an amine function which is able to react with the hydrogenated surface of the material provided at step a). By <<amine function>> is meant herein a function which includes a nitrogen atom comprising a non-bonding electron doublet and of ammonia structure substituted by one or more atoms, in particular by one or more carbon atoms of aliphatic or aromatic type. The definition of an amine function according to the invention notably includes the primary (mono-substitution), secondary (di-substitution) and tertiary (tris-substitution) amine functions, the amidine and guanidine functions. Compound (C) carrying the amine function may be aliphatic (ethylamine, dimethylamine, triethylamine . . . ), saturated heterocyclic (piperidine, piperazine . . . ), or aromatic (of substituted aromatic type such as aniline, or unsaturated heterocyclic type such as pyridine, purine, pyrimidine . . . ). According to the aforementioned definition, the amide, urea and carbamate functions in which the nitrogen doublet is unavailable, are not amine functions.

In one preferred embodiment of the method, the amine function is a primary or secondary amine function. Preferably it is a primary amine. More preferably the amine function is a primary amine function for maximum accessibility to the non-bonding doublet.

Compound (C) carrying a least one amine function may comprise one or more amine functions, the same or different.

Compound (C) optionally carries organic functions other than the amine function (carboxyl, ester, hydroxyl, thiol, aldehydes, ketones, epoxy, carbamate, unsaturation . . . ), via which a material is obtained on which compounds are grafted which carry an organic function. This organic function may allow potential post-functionalization, in particular through the creation of a covalent, Van der Walls or hydrogen bond (for example grafting of a DNA strand capable of recognizing another DNA strand, for DNA chips) or it may form the desired functionality directly. Compound (C) may also comprise one or more functions capable of complexing with biological and/or chemical entities (for example a metal or cation).

Compound (C) carrying an amine function is in particular a functional molecule which can, for example, be an active molecule in the meaning of energy transfer (electron or photoelectron exchange, molecular absorption, fluorescence, electron transport . . . ) such as: a metallic complex, a bioinorganic complex (e.g. a complex of iron porphyrin), a bioorganic (e.g. flavines or ubiquinones), organic or organo-inorganic redox compound, a fluorophore, a chromophore, or a biological molecule selected in particular from among DNA (deoxyribonucleic acid), RNA (ribonucleic acid), a protein, a peptide, an enzyme, an antibody, a carbohydrate. Amine derivatives carrying a hydrophobic aliphatic, unsaturated or fluorinated chain or hydrophilic compounds can be used as compound (C) carrier of an amine function.

Under the conditions of step b), the added compounds (C) are carriers of an amine function which is in the unprotonated state i.e. the amine function is not in the form of its acid salt. Therefore the non-bonding doublet of the amine is available. The reaction medium may however comprise a mixture of compounds (C) carrying amine functions in neutral form and in the protonated state, provided that at least some of these compounds (C) that are present are carriers of an unprotonated amine.

So that at least part of the amine functions that are present is unprotonated, the reaction medium is alkaline or neutral. Advantageously, step b) is conducted in a neutral medium, typically at a pH of the order of 6 to 8, which allows the grafting of sensitive compounds (C), in particular biomolecules. In general, step b) is conducted in a basic medium.

Preferably, the material obtained at the end of step b) is recovered. For this purpose, the liquid phase of the reaction medium of step b) is discarded to obtain the material which is then rinsed for example using buffer solutions and/or water, and then dried to obtain the grafted material.

The method according to the invention has numerous advantages. First, the steps can be implemented under gentle conditions, making it possible not to denature the compounds (C) used which carry at least one amine function. In practice, the method is particularly applicable to most chemical compounds carrying an amine function, in particular to those commercially available.

The grafting of compounds (C) using the aforementioned method has the advantage of generally being very rapid, i.e. generally a number of minutes, which is much faster than other grafting methodologies, such as photochemistry or silanisation for example, which require grafting times generally of the order of a few hours.

Under the conditions of step b), the added compounds (C) carry an amine function which is in the unprotonated state i.e. the amine function is not in the form of its acid salt (quaternary ammonium). Therefore the non-bonding doublet of the amine is available.

Preferably operations are conducted at a pH such that all the amines added to the reaction medium are unprotonated, i.e. in a basic medium (pH>8). However, for chemically fragile molecules (biological molecules, metallic complexes . . . ) it is possible to use gentler pH values (close to neutral, pH 6-8) in which only a fraction of the added amines are deprotonated.

Preferably, the material obtained at the end of step b) is recovered. For this purpose, the liquid phase of the reaction medium of step b) is removed to obtain the material which is then rinsed, for example using buffer solutions and/or water, then dried or packaged to obtain and store the grafted material.

The method of the invention has numerous advantages. Firstly, the steps can be implemented under gentle conditions so as not to denature the compounds (C) used which carry at least one amine function. In practice, the method can in particular be applied to most chemical compounds carrying an amine function, notably to those commercially available.

The grafting of compounds using the aforementioned method has the advantage that it is generally very rapid, i.e. generally a number of minutes. This rapid execution is a favourable advantage for conducting functionalization in small volumes that are thus subject to strong evaporation, thereby allowing the rationalized grafting of molecules with high added value.

The method of the invention has the advantage of being simple, low-cost and allowing the grafting of compounds (C) in a single reaction step starting from a hydrogenated material: step b).

Without wishing to be bound by any particular theory, the work conducted by the inventors permits the suggestion that grafting takes place as follows:
  either the compounds (C) carrying at least one amine function are grafted onto the surface by means of the hydrogenated carbon/silicon/germanium via their amine function at step b). The nitrogen of the amine function of compound (C) carrying an amine function placed in contact at step b) is one of the atoms which takes part in the bonding between compound (C) and the surface. For this purpose, the reaction at step b) is conducted under conditions which permit the forming of the bond between the nitrogen atom of the amine function of compound (C) and the surface.
  or, the nitrogen atom is eliminated during the reaction and it is the alpha carbon atom of the nitrogen which is grafted to the material via the setting up of a covalent bond.

Irrespective of the atoms involved in the bonds between the compounds (C) and the surface, strong bonds are set up between compound (C) and the material. The inventors have therefore evidenced that these bonds are generally not broken by placing the material with the grafted surface under strong acid or strong basic conditions, with or without sonication, which leads to assuming that the bonds set up are covalent bonds. The chemical stability of the created bonds is an additional advantage of the method.

Preferably, step b) is conducted in an aqueous medium. By <<aqueous medium>> is meant media chiefly consisting of water, preferably aqueous solutions. In general, the pH of the aqueous medium is equal to or higher than the pKa of the amine of compound (C) used at step b), by which it can be ensured that the majority of the amines are unprotonated in the medium and compound (C) can be grafted. Aqueous solutions of phosphate or hydrogen carbonate are particularly preferred. To limit drying phenomena, an agent to delay drying can be added such as glycerol (Sigma Aldrich®).

According to one advantageous embodiment, when step b) of the aforementioned methods is conducted in a solvent, the solvent is saturated in air.

In one embodiment, at step b) the material is polarized anodically at an electrochemical potential of between −0.5 and 0.9V vs Ag/AgCl. The potential is generally lower than the oxidation potential of the amine function (of the order of 1.3 V vs Ag/AgCl). This potential allows forced migration of compound (C) carrying the amine function if it is positively charged (negative applied potential, preferably of between 0 and −500 mV vs Ag/AgCl) or negatively charged (potential applied lower than the oxidation potential of the amine and preferably between 0 and +900 mV vs Ag/AgCl). The application of a potential may prove to be of interest in order to operate using solutions of very low concentrations, but is generally not necessary to obtain the desired grafting of the invention.

This potential, at least in some cases, is able to reinforce the electron acceptor role of the surface and to improve grafting.

This embodiment is particularly adapted for materials of metallic type or heavily doped semiconductor materials.

Preferably, the grafting method of the invention (step b) is conducted at ambient temperature, at atmospheric pressure and in air. The method of the invention does not necessitate UV illumination of the surface.

In one embodiment of the method, step b) is conducted on a determined part of the surface.

The method has the advantage that it is able to be performed on a determined part of the surface i.e. the grafting of compounds (C) in localized manner on the surface is possible from millimetric scale to nanometric scale. The localized contacting region may be centimetric (typically having a characteristic size of between 1 and 100 cm), millimetric (typically having a characteristic size of between 1 and 100 mm), micrometric (typically having a characteristic size of between 1 and 1000 µm, in particular between 1 and 100 µm) or nanometric (typically having a characteristic size of between 1 and 1000 nm, in particular between 1 and 100 nm). The possibility of localized deposits is highly advantageous since it allows numerous applications requiring chemical multiplexing of the surface, for example for the preparation of biochips or biosensors for which it is essential to be able to create numerous localized regions on the surface of a material, these areas being of the smallest possible scale, since the biosensors or biochips obtained from said material are advantageously miniaturized whilst permitting multiple detections of chemical or biological entities whose presence is to be determined. In addition, it is also sought to achieve miniaturization of components for electronics, optoelectronics, molecular electronics, bioelectronics.

This localization can be performed using different technological means including droplet depositing (spotting, dropcasting, ink-jet printing), coating processes (stamping, serigraphy, flexography, heliography, micro-contact printing), lithography, or near-field printing (AFM, nanofountain pen, dip pen lithography) or surface functionalization in a micro- or nano-fluidic channel.

The following articles illustrate some of the technological means which can be used to carry out localized grafting, and highlight the advantages of localization and the possible applications of a grafted material with localized functionalization: a) E. Descamps et al. Adv. Mater., 19 (2007) 1816-1821. (DNA biochip)—b) Y. Roupioz et al. Small 5 (2009) 1493-1497 (organization of a network of unique structures)—c) M. Geissler et al., Adv. Mater. 2004, 16, 1249; A. N. Shipway et al., ChemPhysChem 2000, 1, 18 (advantage of multiplexing and applications in photonics, molecular electronics and biosensors)—d) S. H. Hong et al., Science 1999, 286, 523. (dip pen nanolithography, multiplexing)—e) K. T. Rodolfa et al., Nano Lett. 2006, 6, 252. (nanofountain pen).

To the knowledge of the inventors, the method of the invention is the first method allowing the grafting of compounds, in particular compounds (C) carrying an amine function, onto materials whose surface comprises $sp^3$ hybridized silicon, germanium and/or carbon, in particular without the need for the material to be doped.

In another embodiment, step b) is conducted on the entirety of the surface, in particular by dip coating in a solvent as explained above.

According to a second aspect, the subject of the invention concerns the grafted materials able to be obtained using the above-mentioned methods.

Preferably, the material was grafted with compounds (C) in localized manner onto a determined part of the surface, which has the above-mentioned advantages.

The surface of the grafted material obtained with the method is functionalized with compounds (C). A more or less compact monolayer of compounds is obtained on the surface. The compactness of the monolayer may however be increased if step b) is conducted at basic pH (i.e. such that the pH is higher than the pKa of the amine) and by increasing the reaction time at step b).

The grafted material obtained with the method is therefore functionalized on the surface with compounds (C) which may comprise functional groups (in addition to the amine function used for grafting). These functional groups may therefore impart a function of interest to the surface, for applications in the fields of electronics, optoelectronics, molecular electronics, bioelectronics, the environment, tribology, photovoltaics and the biomedical field.

According to a third aspect, the invention concerns the use of the grafted material obtained using the above-mentioned method for the preparation for example of biosensors, biochips, components for electronics, optoelectronics, molecular electronics, bioelectronics, the environment, tribology, photovoltaics and the biomedical field.

When manufacturing devices for molecular electronics (integrated circuit, logic circuit, data storage . . . ) and bioelectronics (biochips, biosensors, medical electrodes . . . ) the materials can in particular be used as follows:

using a pre-functional approach, by grafting compounds (C) carrying an amine function, and preferably carrying organic functions other than the amine function, onto a material using the method according to the invention, then using the (preferably functional) material obtained for the preparation of a (bio)-electronic device, or using a post-functional approach, by manufacturing the electronic device using methods known to those skilled in the art, then chemically modifying the same by grafting compounds (C) carrying an amine function, and preferably carrying organic functions other than the amine function. In this case, functionalization takes place as final step for local implementation of the functions on the integrated circuit/biosensor/biochip. The aspects of rapid grafting, possible localization and implementation under gentle conditions are particularly advantageous for such uses.

The materials employed for the aforementioned uses are typically materials able to be obtained using the method of the invention from an initial material which, on its surface comprises carbon, silicon and/or germanium semiconductor atoms.

A molecular electronic circuit is an electronic component reproducing one or more electronic functions of greater or lesser complexity, of which at least one is assumed by a functional molecular edifice often integrating several types of basic electronic components within a reduced volume, making the circuit easy to use.

If a material such as obtained using the method of the invention comprises semi-conductive silicon, it can be used as wafer, i.e. a fairly thin disc of semiconductor material used as substrate for the preparation of micro-structures using techniques such as doping, etching, the deposit of other materials (epitaxy, sputtering, CVD, . . . ) and photolithography. It is of crucial importance in the preparation of integrated circuits.

A bioelectronic device is a device such as previously described but which integrates a selective biological function. The inorganic part of the device is then used as transducer for a phenomenon of bio-molecular recognition oriented by the biomolecule or bioreceptor. A biosensor is therefore formed of a bioreceptor of biological origin: enzyme, antibody, receptor . . . and of a transducer in charge of converting the biological signal (for example the fixing of the antigen to be detected onto the antibody) into a signal that can be given easy use (generally electric or light signal).

A biochip corresponds to more or less bulk parallelization of a set of bioreceptors such as DNA molecules or any other molecular recognition element (peptide, protein, antibody, carbohydrate, small ligand, receptor, aptamer) fixed in ordered rows on a small surface of the material according to the invention. Biochips allow multi-parameter quantitative analysis of biological events for example, to quantify the level of expression of genes (transcripts) in a cell of a given tissue (liver, intestine . . . ), at a given time (embryo, adult . . . ) and in a given condition (diseased, healthy . . . ).

In particular a material grafted with a compound (C), in particular of the type and comprising one or more other organic functions, is capable of binding (in particular via covalent, hydrogen, Van der Waals bond, complexing . . . ) with a chemical or biological entity, this material then allowing the detection even the quantification of the chemical or biological entity, and can therefore be used as biosensor. In particular, when compound (C) is a biological molecule, in particular such as defined above, and comprising one or more other organic functions capable of binding with a biological entity, the material can be used as biochip.

The invention is further illustrated by the appended figures and examples given below.

FIGURES

Figure 3:
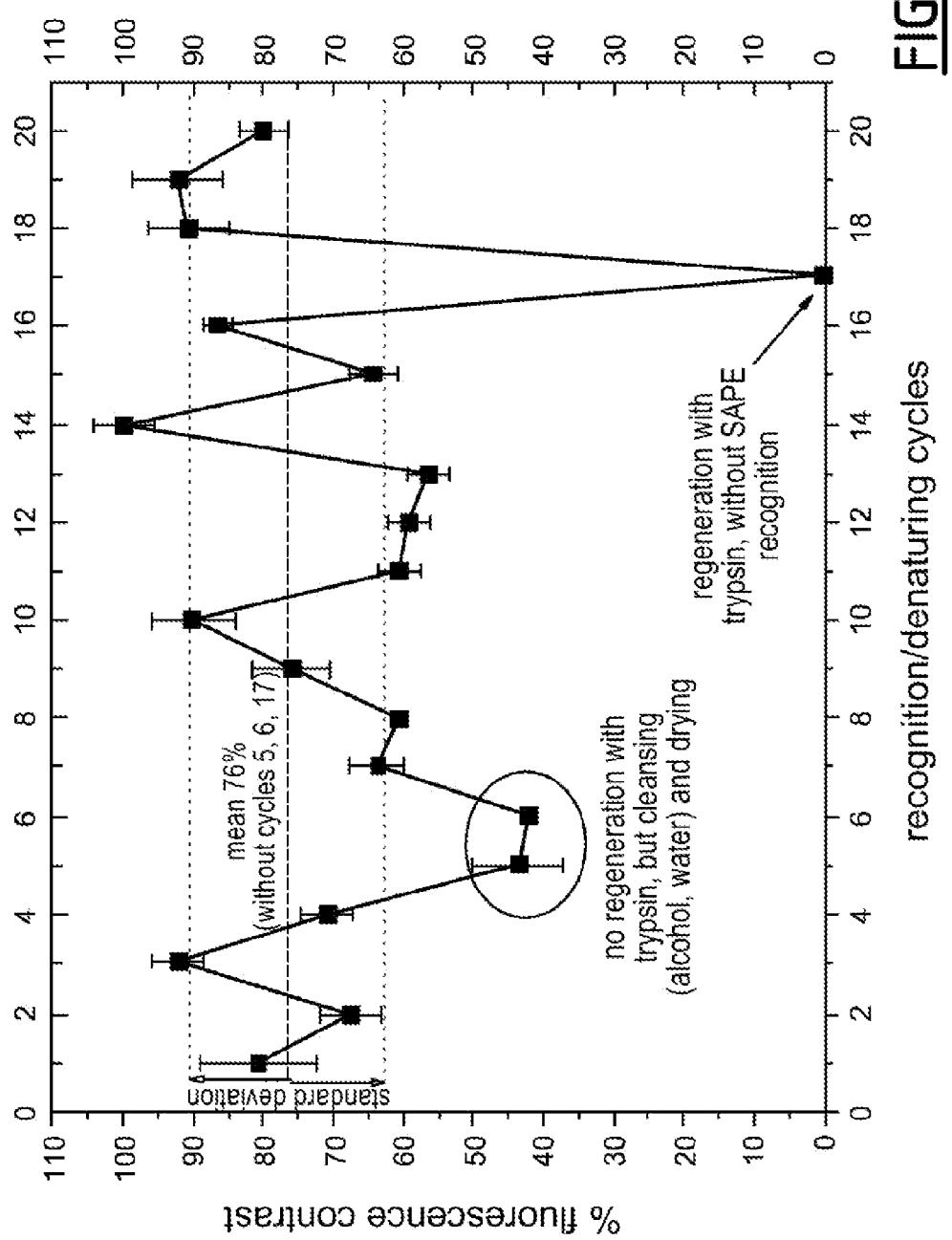

FIG. 3 illustrates the relative trend in fluorescence contrast (expressed as a % of the maximum contrast) in relation to the number of recognition-denaturing cycles of the grafted biotin/SAPE complex: without regeneration of the biotins for cycles 5 and 6; with regeneration of the biotins using trypsin for cycles 1-4 and 7-20, but without recognition by SAPE for cycle 17 (Example 1).

Figure 4:
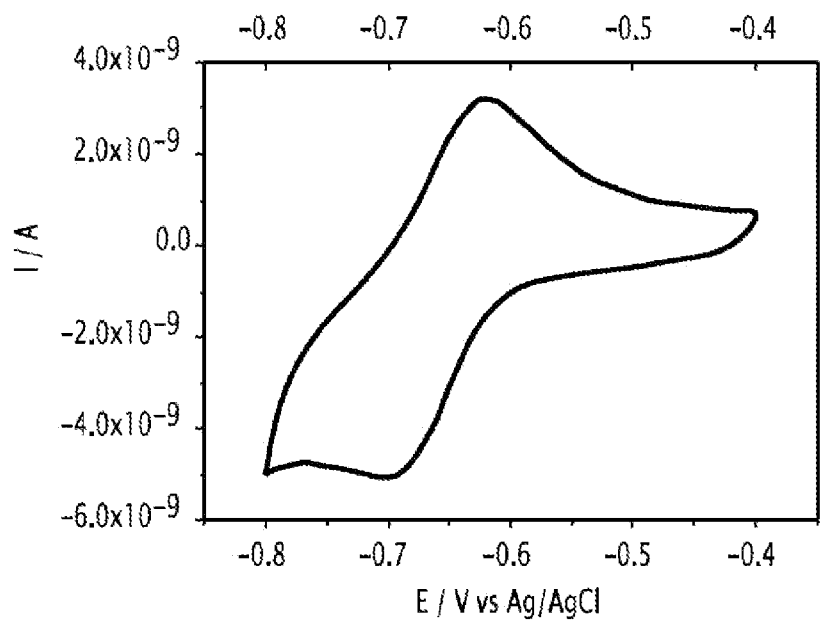

FIG. 4 is a recorded voltammogram for a diamond surface functionalized with artificial PyridoAcridone (denoted PyAc) in a 0.1M solution of phosphate at pH 6.2, at a scan rate of 10 mV/s (Grafting of PyAc: 1 mM of PyAc in 0.1M phosphate with 20% glycerol, at pH 11, and a grafting time of 30 min) (Example 4).

Figure 5:
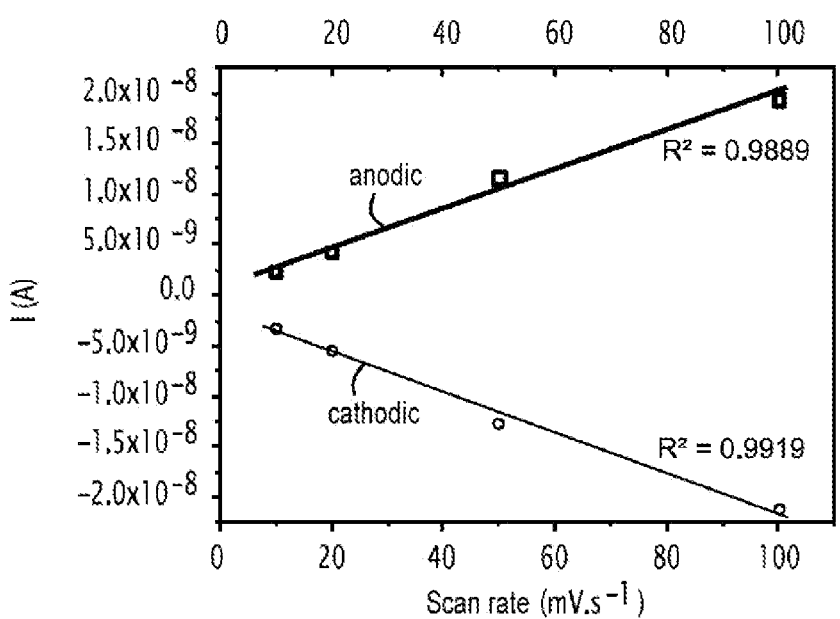

FIG. 5 shows the trend in the current intensity of the oxidation and reduction peaks in relation to the scan rate of a diamond surface functionalized with artificial PyridoAcridone (denoted PyAc) (Grafting of PyAc: 1 mM of PyAc in 0.1 M phosphate with 20% glycerol, at pH 11, and a grafting time of 30 min) (Example 4).

Figure 6:
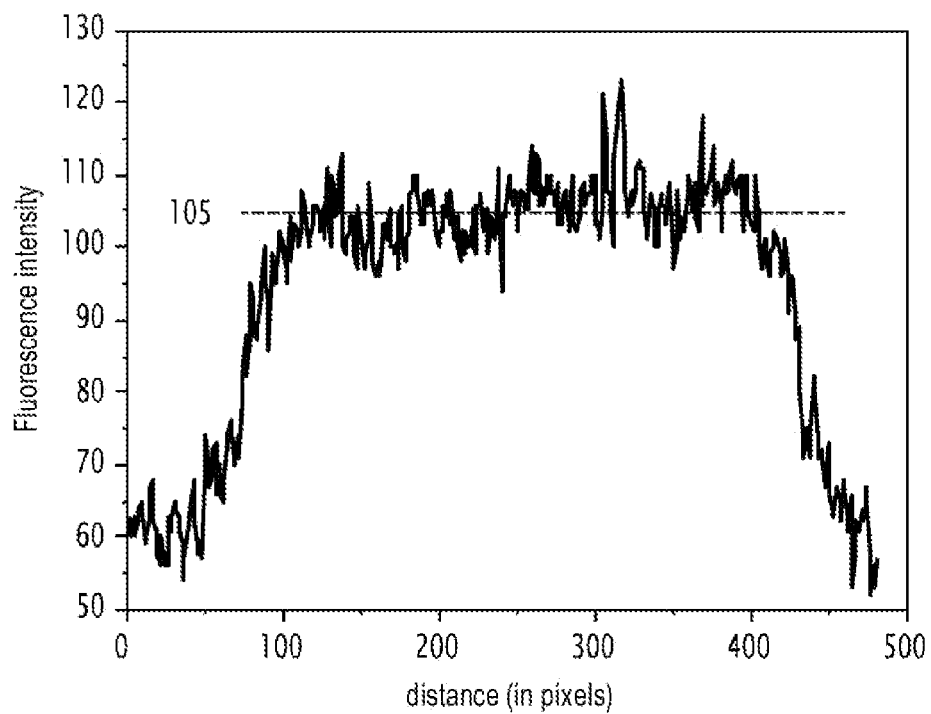

FIG. 6 shows the fluorescence intensity of a fluorescence image detected by SAPE of the grafting of biotin-PEO2-amine onto silicon, under normal conditions (0.1M phosphate buffer, pH 11, contact time 5 minutes, 15 mM concentration of biotin-PEO2-amine) as a function of distance (Example 5).

Figure 7:
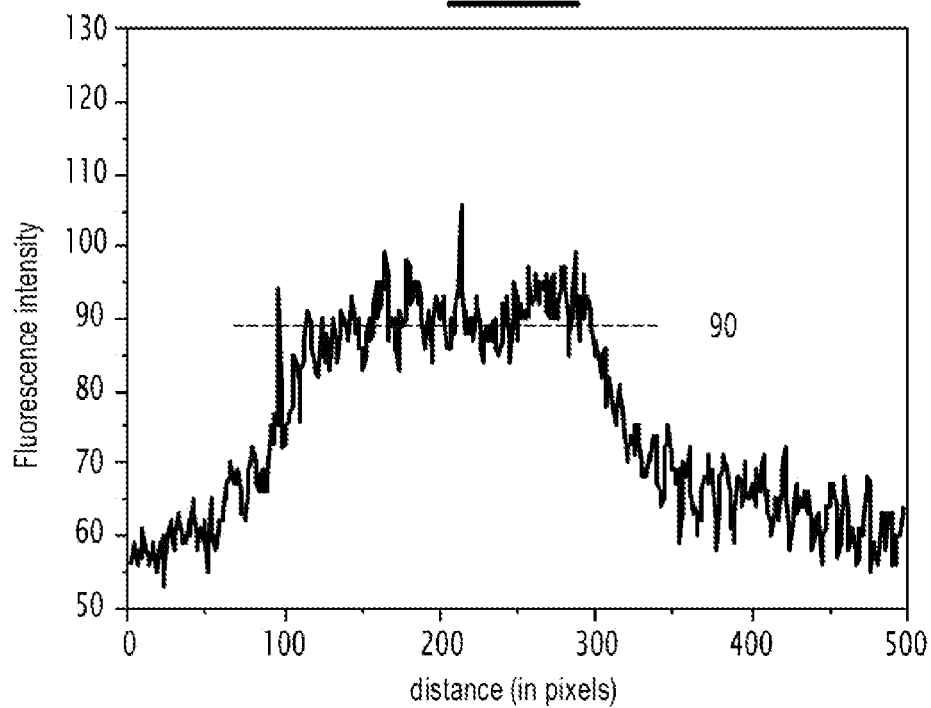

FIG. 7 shows the fluorescence intensity of a fluorescence image detected by SAPE of the grafting of biotin-PEO2-amine onto silicon, in a partly deoxygenated solution (0.1 M phosphate buffer, pH 11, contact 5 minutes, 15 mM concentration of biotin-PEO2-amine) as a function of distance (Example 5).

Figure 8:
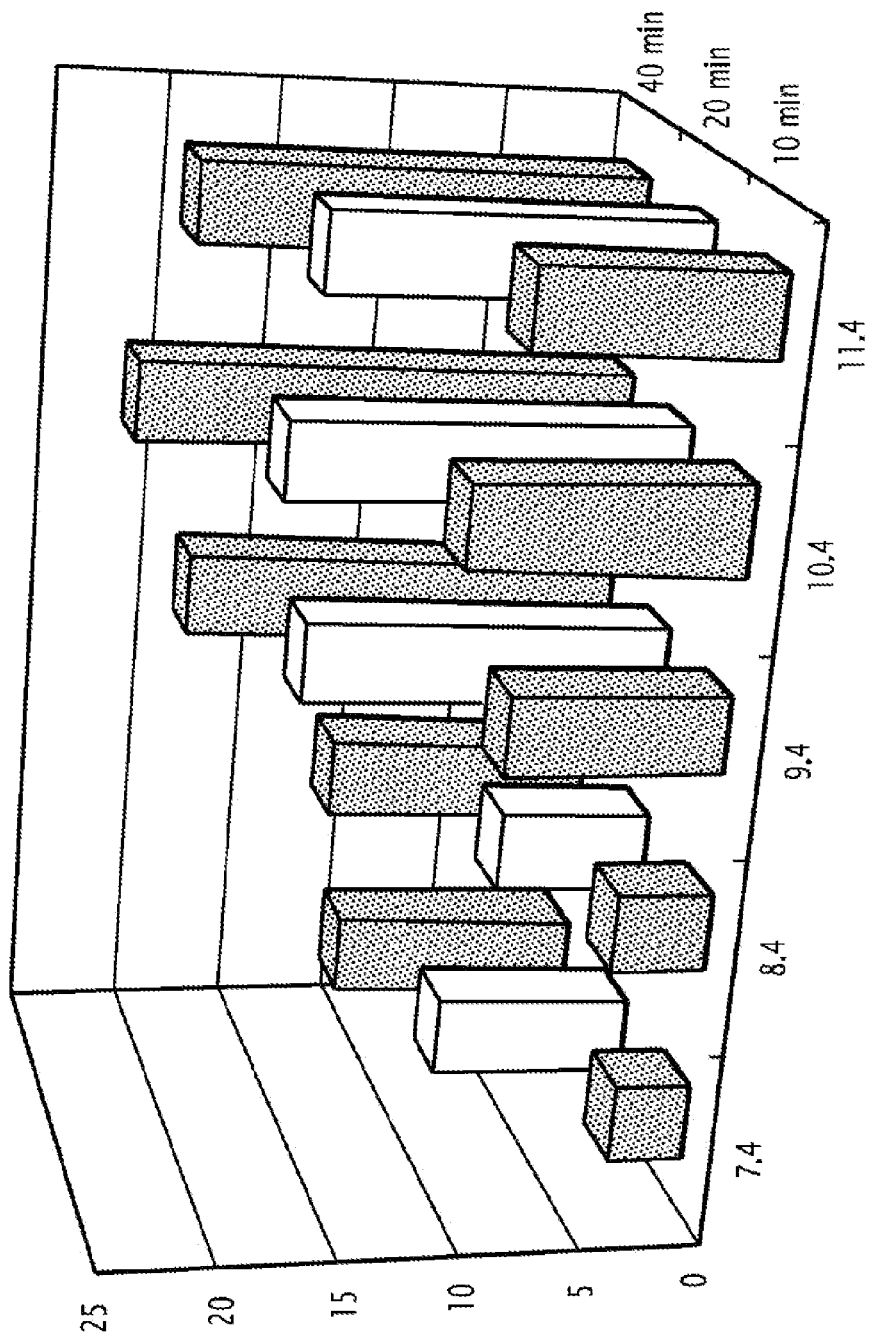

FIG. 8 gives histograms of the fluorescence intensities of fluorescence images detected by SAPE of the grafting of biotin-PEO2-amine, observed for each of the 15 pairs [pH of the solution when grafting—grafting time].

EXAMPLES

Example 1

Grafting of Biotin-Peo2-Amine (Primary Aliphatic Amine) on Diamond

The aqueous solutions used were 0.1 M phosphate solutions at pH 11 or 0.1 M buffer solutions of hydrogen carbonate at pH 11. The pH value plays a predominant role in grafting, allowing deprotonation of the amine, which reinforces its nucleophilic nature. On account of the small size of the spots, glycerol (Sigma Aldrich®) was added to the aqueous solutions to the proportion of 1-20% by volume so as to limit drying phenomena, during the time of chip preparation, which was initially observed without the addition of glycerol.

To prepare the grafting solution, 15 ml of glycerol were dissolved in 35 ml of ultra pure water. 710 mg of sodium phosphate ($Na_2HPO_4$) were dissolved in 50 ml of the previously prepared water-glycerol solution and the pH was adjusted to 11 with 3M sodium hydroxide (NaOH). 19 mg of biotin-PEO2-amine (Pierce®) were dissolved in the previously prepared solution.

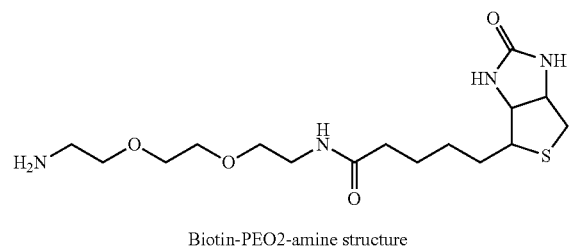

Biotin-PEO2-amine structure

A needle of capacity 80 µl was then filled (see Spotting section for an explanation of the automatic spotting equipment) which deposited one drop by contacting with the diamond (the contact time was 3 seconds). The drop was kept in contact for between about thirty seconds and one minute. The diamond was then rinsed with Phosphate Buffer Saline solution (PBS) containing phosphate buffer, then abundantly with water.

*Influence of the Type of Solvent

The fluorescence images of the grafted surfaces obtained show that an optimal grafting rate is obtained with basic aqueous solutions, but other solvents (DMSO) if hydroxide ions are added thereto may also be used but with lower grafting yields.

*Specificity of Grafting

The fluorescence images of the grafted surfaces obtained show the specificity of the grafting when comparing grafting with biotin and grafting with biotin-PEO2-amine. The biotin is devoid of an amine function and is not grafted onto the surface of the diamond, whereas biotin-PEO2-amine is grafted onto the surface.

*Application of a Potential During Grafting

The fluorescence images of the grafted surfaces obtained also show the effect related to the application of a potential of 0.8 V when depositing the biotin-PEO2-amine. This potential lies at the foot of the oxidation wave of the amine (for a primary or secondary amine). Oxidation of the amine is not the triggering element of grafting, having regard to the respective fluorescences obtained with and without application of a potential.

*Characterization of the Surfaces

Figure 1:
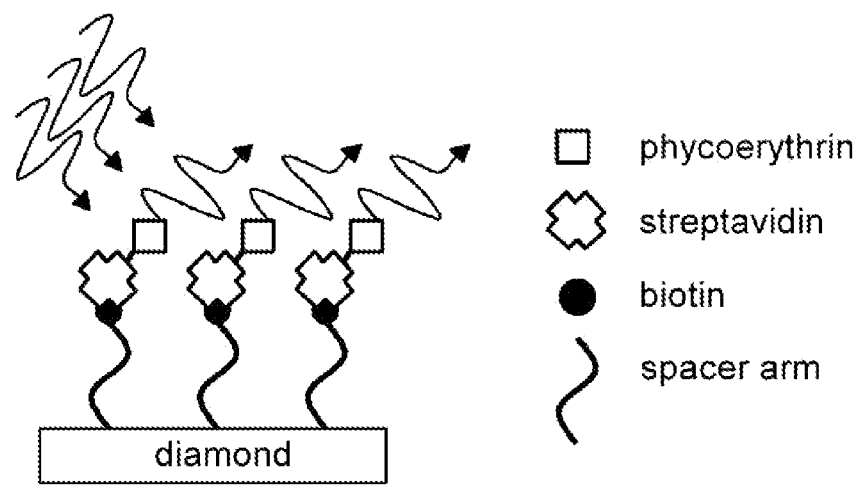
FIG. 1 is a block diagram of the fluorescence used in all the examples.

The characterization method used was fluorescence microscopy, which allows the use of the biotin-avidin pair as biological model. After grafting the biotin-PEO2-amine, detection was performed using a fluorophore: SAPE (Streptavidin-R-Phycoerythrin) (FIG. 1).

The operating mode was as follows. After grafting the biotin-PEO2-amine, the following steps were carried out:

Rinsing with PBS (Phosphate Buffer Saline solution containing 10 mM phosphate buffer, 0.137 M of NaCl and 2.7 mM of KCl, at pH 7.4) then with deionised water after grafting.

Depositing B.S.A. (Bovine Serum Albumine, Sigma Aldrich®) for ten minutes.

Rinsing with PBS.

Incubation in the presence of S.A.P.E (Molecular Probes®) at 0.1 mg/mL in PBS, for ten minutes in the dark.

Rinsing with PBS.

Fluorescence detection.

The BSA deposit allows blocking of a maximum number of non-specific absorption sites located on the surface of the diamond. This phenomenon is increased when grafting large molecules and in particular macromolecules such as proteins which offer a wide diversity of functional groups located on their contours. This effect can be overcome by means of a protein, B.S.A., at a concentration of 1 mg/ml. This solution was deposited on the sample for ten minutes. This leads to the adsorption of the B.S.A. on nearly all the non-specific adsorption sites and only these sites, on the other hand the regions functionalized with biotin do not form adsorption regions for the B.S.A. protein which is therefore removed by PBS rinsing before the forming of the biotin-streptavidin complex.

Phycoerythrin is the protein containing the fluorophore. The excitation wavelength range of the latter is between 496 and 565 nm and it emits at 578 nm.

*Stability of Grafting Evaluated in Harsh Media

After grafting biotin-PEO2-$NH_2$ onto a diamond sample, an additional study on the stability of grafting in harsh media was conducted:

The sample was successively dipped in different neutral (phosphate buffer, pH=7.2), acid ($H_2SO_4$, pH=0.8) and basic (KOH, pH=12.1 and pH=13.7) solutions for 15 minutes in an ultrasonic bath. These experiments were conducted over a period of 2 months.

At each step, the presence of biotin grafted on the surface of the diamond was detected by fluorescence.

Finally, it was found that the fluorescence contrasts did not change either as a function of time or as a function of the different types of attack.

These experiments therefore allow the conclusion to be drawn that the grafting of the molecules on the diamond surface is stable through the presence of amines.

*Stability of Grafting Evaluated Via Repeated Coupling-Denaturing Cycles

Figure 2:
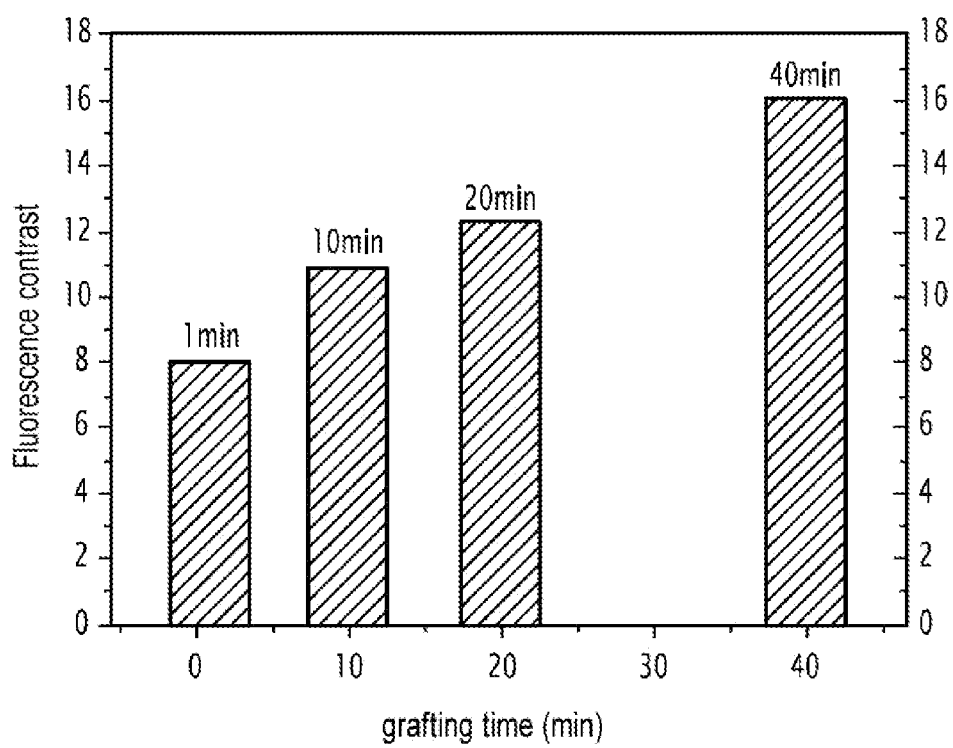
FIG. 2 shows fluorescence contrast in relation to the duration of the grafting reaction (40 min, 20 min, 10 min and 1 min) of biotin-PEO2-amine (1 mM) onto the surface of diamond (0.1 M phosphate, pH 11, 20% glycerol) (Example 1).

The stability of grafting was assessed using repeated cycles of coupling-denaturing. FIG. 2 shows the trend in fluorescence contrast as a function of grafting time. By contrast is meant normalization of the specific signal (spot fluorescence less background fluorescence) compared with the background signal.

FIG. 2 shows the efficacy of grafting. For the shorter time, 1 min, the specific signal is 8 times higher than the background signal (contrast of 8). As previously mentioned, the grafting time allows densification of the surface with the biological probe (biotin). This shows the possibility of modulating the coverage rate of the surface via time control, depending on whether it is desired to have access to a slightly grafted surface (enzymatic, amperometric biosensors) or a surface <<saturated>> with functional molecules (c.f. Example 4).

FIG. 3 shows the relative trend (expressed as a % of initial contrast) over the recognition-denaturing cycles. For cycles 5 and 6, trypsin was not used to regenerate the biotins on the surface of the diamond: the sample was only rinsed with alcohol and water and then dried. Hence the lowered fluorescence related to the blocking of numerous sites by a fluorophore degraded in terms in spectral properties.

For cycle 17, trypsin regenerated the surface biotins. However, to show the efficacy of surface regeneration and to produce a blank, the surface was subjected to the coupling protocol in the absence of SAPE, hence the (expected) absence of fluorescence.

Cycle 18, after recognition with SAPE allows confirmation that trypsin breaks the bonds between the biotin and the streptavidin of SAPE without breaking the bond between the surface of the diamond and biotin.

In terms of stability (FIG. 3), since the association constant between biotin and streptavidin is very high, the bond between these molecules is broken by means of a protease, trypsin, which enzymatically degrades SAPE (by fragmentation of the peptide chain). After enzymatic digestion, the freed biotin can again be involved in the recognition mechanism with SAPE. The observed fluorescence displays some degree of fluctuation (already observed with other grafting techniques [Yang et al., Nature Materials 1, 253-257, 2002] and inherent in fluorescence microscopy). However, for cycles 5 and 6, fluorescence was lesser. There had been no enzymatic degradation SAPE. Any additional recognition by a new fluorescent molecule is blocked and the gradual decrease in specific fluorescence is due to degradation of the previously recognized fluorophore. Regeneration with trypsin (conducted for cycles later than FIG. 3) again allowed a maximum number of available biotins to be obtained that are accessible to the SAPE which was used for the following detections.

In this manner, the reproducibility of successive detections is ensured.

Example 2

Grafting of Biotin-Peo2-Amine (Primary Aliphatic Amine) on Diamond in Localized Manner

*Spotting

Localized grafting is performed by <<spotting>> (Genomic Solution®) which allows parallelization and densification of the deposits. Programmable spotting apparatus depositing droplets of diameter 150 µm by contact with the substrate was used. The needle containing the solution to be deposited was filled under capillarity from filler tanks. The contact time with the substrate was 3 seconds.

*Microcontact Printing

This technique consists of creating a pattern on a surface by depositing a compound. It requires the preparation of a PDMS buffer (polydimethylsiloxane, sylgard 184 (V.W.R.®)) comprising the desired patterns, the PDMS is then impregnated with the solution to be deposited, it is lightly dried and the buffer is placed on the region to be functionalized.

The fluorescence images obtained show the feasibility of grafting the biotin-PEO2-amine by microcontact printing on nanocrystalline diamond with spots of 200 µm.

Example 3

Grafting of Para-Aminobenzoic Acid (Primary Aromatic Amine) on Diamond

For primary aromatic amines, experiments were conducted with para-aminobenzoic acid (APAB, Sigma Aldrich®). The first step involved grafting the APAB (1 mM) under the same conditions as the biotin-PEO2-amine (0.1 M phosphate, contact time 15 minutes).

The coupling of the acid group of APAB with the amine group of the biotin-PEO2-amine was then performed. For this purpose, first the activated ester was formed using EDC (1-ethyl-3-(3-dimethylaminopropyl)carbodiimide, Sigma Aldrich®) and sulfo-NHS (Sigma Aldrich®), and then the activated ester was coupled to the amine of the biotin-PEO2-amine.

*Efficacy of Grafting in Relation to the pH of the Solution Used for Grafting Apab on Diamond The fluorescence images obtained show that an increase in the pH of the solution is accompanied by an increase in fluorescence, and hence in the efficacy of grafting. Grafting is more efficient when the pH of the solution is higher.

This experiment allowed three elements to be shown which give full advantage to the present invention:
1. It clearly shows the grafting of an aromatic amine;
2. It highlights the possibility of adding a chemical primary onto a surface of interest allowing the extemporaneous grafting of a function of interest,
3. It provides the possibility of multiple-grafting of a surface via differentiated chemistry.

Example 4

Grafting of Artificial Pyridoacridone on Diamond and Quantification of Grafting

To estimate the quantity of molecules grafted on the surface, we chose the electrochemical method. Via a primary aliphatic amine we grafted a probe molecule containing the rapid, reversible electrochemical pair quinone-imine. This molecule is an artificial pyridoacridone modified by a polyamine arm, it is denoted PyAc below.

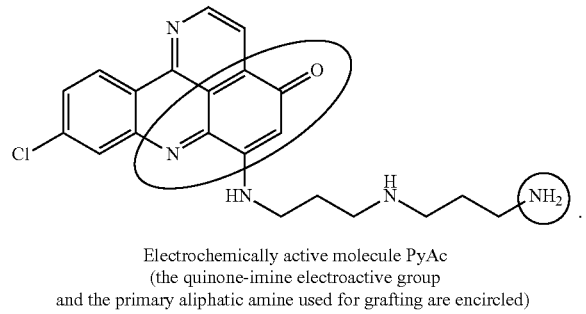 [SMILES: NCCCNCCCNC1=CC(=O)c2ccnc3c2c1nc1cc(Cl)ccc13 ; "."]

Electrochemically active molecule PyAc
(the quinone-imine electroactive group
and the primary aliphatic amine used for grafting are encircled)

Conventional grafting was carried out in a 0.1 M phosphate solution at pH 11 containing 1 mM PyAc for 30 min.

Electrochemical characterization by cyclic voltammetry of the grafted surface allowed the conclusion to be drawn firstly regarding the reality of immobilization (changes in peak current with potential scan rate) and secondly regarding the quantity of grafted molecule per unit surface area (via integration of the charge underneath the oxidation and reduction peaks).

FIG. 5 shows the changes in current of the anode and cathode peaks with the potential scan rate v. The characteristic trend of a time system i.e. involving a species immobilized on the surface of the electrode in finite quantity is recorded with a trend in peak currents directly proportional to the scan rate.

FIG. 4 gives a typically recorded voltammogram for a surface functionalized with PyAc. The integration of the current under the oxidation peak, excluding the capacitive current (or underneath the reduction peak) makes it possible, using Faraday's law, to estimate the quantity of molecules immobilized per unit surface area, with the knowledge that the PyAc molecule exchanges 2 electrons per grafted entity. Our graft rate can be evaluated at $7.10^{-11}$ mol.cm$^{-2}$. This measurement validates the obtaining of a relatively dense monolayer (for this molecule size, a compact layer typically contains $10^{-10}$-$10^{-11}$ mol.cm$^{-2}$).

Example 5

Grafting of Biotin-PEO2—NH$_2$ on Silicon

Hydrogenation of the silicon surface was performed using 48% HF for 30 min immediately followed by functionalization with biotin-PEO2—NH$_2$.

The grafting conditions for Example 1 were repeated replacing diamond by silicon (0.1 M phosphate, pH 11, contact time 30 minutes). The fluorescence images obtained and the comparison between FIGS. 6 and 7 both show that grafting is effective and that the presence of oxygen during grafting promotes grafting.

Example 6

Influence of Grafting Parameters for Biotin-PEO2-Amine on Diamond

The aqueous solutions used were 0.1 M phosphate buffer solutions of pH 7.4, 8.4, 9.4, 10.4, and 11.4, pH 11. The pH plays a predominant role in grafting, allowing deprotonation of the amine which reinforces its nucleophilic nature. Grafting is only possible if the amine is at least partly in the unprotonated state.

Owing to the small size of the spots, glycerol (Sigma Aldrich®) was added to the aqueous solutions to the proportion of 1-20% by volume, so as to limit phenomena of drying during the preparation time of the grafted material, which was initially observed without the addition of glycerol.

To prepare the grafting solutions, 15 ml of glycerol were dissolved in 35 ml of ultra pure water. 710 mg of sodium phosphate (Na$_2$HPO$_4$) were dissolved in 50 ml of the previously prepared water-glycerol solution, then the pH was adjusted to the above-mentioned values using 3M sodium hydroxide (NaOH) 3M. 19 mg of biotin-PEO2-amine (Pierce®) were dissolved in the previously prepared solution.

A needle of 80 µl capacity was filled (see Spotting section for an explanation of the automatic spotting apparatus) which deposited a droplet by contact with the diamond (the contact time was 3 seconds). The droplet was kept in contact with the hydrogenated diamond for three different grafting times of 10, 20 and 40 min. The diamond was then rinsed with Phosphate Buffer Saline solution (PBS) containing phosphate buffer then abundantly with water.

*Characterization of the Surfaces

The characterization method used was fluorescence microscopy which allows use of the biotin-avidin pair as biological model. After grafting the biotin-PEO2-amine, detection was performed using a fluorophore which was SAPE (Streptavidin-R-Phycoerythrin) (FIG. 1).

The operating mode was the following. After grafting the biotin-PEO2-amine, the following steps were conducted:

Rinsing with PBS (Phosphate Buffer Saline solution containing 10 mM phosphate buffer, 0.137 M of NaCl and 2.7 mM of KCl, at pH 7.4) then with deionising water after grafting.

Depositing B.S.A. (Bovine Serum Albumine, Sigma Aldrich®) for ten minutes.

Rinsing with PBS.

Incubation in the presence of S.A.P.E (Molecular Probes®) at 0.1 mg/mL in PBS for ten minutes in the dark.

Rinsing with PBS.

Detection by fluorescence.

The depositing of BSA allows the blocking of a maximum number of non-specific absorption sites located on the surface of the diamond. This phenomenon is increased if large molecules are grafted, in particular macromolecules such as proteins which offer a wide diversity of functional groups on their contours. This effect is overcome by using a protein, B.S.A., at a concentration of 1 mg/ml. This solution was deposited on the sample for ten minutes. This leads to adsorption of the B.S.A. on nearly all the non-specific adsorption sites and only these sites, on the other hand the regions functionalized with biotin do not form adsorption regions for the B.S.A. protein which is therefore removed by rinsing with PVS before forming of the biotin-streptavidin complex.

Phycoerythrin is the protein containing the fluorophore. The excitation wavelength range of the latter is between 496 and 565 nm and it emits at 578 nm.

FIG. 8 gives the histogram of the fluorescence intensities observed for each of the 15 tested pairs pH/grafting time. The different spots have a size of 250 µm and are arranged in the form of a network of spots (3 rows and 5 columns) deposited on one same diamond, which allows a comparative study of the parameters.

It clearly appeared that the trend in fluorescence changes in accordance with conditions, demonstrating the possible multiplexing of intensive data (here the surface concentration of immobilized biotin) in spots on one same substrate.

*Influence of grafting time

The fluorescence images obtained of the grafted surfaces show that the graft rate increases with grafting time. The recorded contrasts given in FIG. 8 show a continuous increase in the fluorescence of the spots with an expected plateau observed owing to surface saturation with the protein fluorophore.

On the other hand, the surface fluorescence of the diamond between the spots (which was not grafted) is low and constant, demonstrating the spatial localization of grafting on the spots.

*Influence of pH

Irrespective of grafting time, the fluorescence images obtained of the grafted surfaces show a similar trend. No grafting was obtained with pH values of less than 7.4 (since the amine is completely protonated). On and after this pH, even if the fraction of deprotonated amine remains low (of the order of 1%), grafting is effective with fully significant fluorescence contrasts (FIG. 8). If the molar fraction of deprotonated amine increases, in other words if the pH is increased, the fluorescence contrast increases up to an optimum pH of around 10.4 (irrespective of grafting time). Beyond this value, a slight decrease in contrast is observed.

Example 7

Grafting of DNA-amine

The aqueous solutions used were 0.1M phosphate buffer solutions of pH 7.4. The pH value plays a predominant role in grafting, allowing deprotonation of the amine, which reinforces its nucleophilic nature. However, the immobilized probe DNA strands (-Zip9: $NH_2$—$(CH_2)_6$-TTT-TTG-ACC-ATC-GTG -CGG-GTA-GGT-AGA-CC (SEQ ID NO:1) and Zip6: $NH_2$—$(CH_2)_6$-TTT-TTG-ACC-GGT-ATG-CGA-CCT-GGT-ATG-CG (SEQ ID NO:2), Eurogenetec) on their nucleic bases have aromatic amines which are nevertheless much less reactive. The choice of a low grafting pH therefore firstly allows the demonstrated immobilization of fragile molecules under non-denaturing conditions, and secondly avoids inhibition of the DNA target/DNA probe recognition phenomenon, hybridization, through the grafting of nucleic amines involved in the formation of the hydrogen bonds and the bases of selectivity in the double strand.

Owing to the small size of the spots, glycerol (Sigma Aldrich®) was added to the aqueous solutions to the proportion of 1-20% by volume so as to limit phenomena of drying during the preparation of the grafted material (DNA biochip) which was initially observed without the addition of glycerol.

To prepare the two grafting solutions, 15 ml of glycerol were dissolved in 35 ml of ultra pure water. 710 mg of sodium phosphate ($Na_2HPO_4$) were dissolved in 50 ml of the previously prepared water-glycerol solution and the pH was adjusted to pH 7.4 using 3M sodium hydroxide (NaOH). 1 µm of each oligonucleotide-amine was dissolved in the two previously prepared solutions.

A needle of capacity 80 µl was then filled with one of the aminated DNA-probe solutions (see Spotting section for an explanation of the automatic spotting apparatus) which deposited one drop thereof by contact with the diamond (contact time 3 seconds). The drop (diameter 250 µm) was kept in contact with the hydrogenated diamond for 15 minutes. The diamond was then rinsed with Phosphate Buffer Saline solution (PBS) containing phosphate buffer, then abundantly with water. After rinsing the spotting needle with deionised water then with phosphate buffer followed by drying, a second spot was deposited with the second aminated probe strand at a distance of 200 µm. After the same grafting time, the diamond surface was again rinsed with phosphate buffer.

*Characterization of the Surfaces

The characterization method used was fluorescence microscopy which allows the use of the biotin-avidin pair to detect hybridization. After grafting each oligonucleotide-amine in two contiguous but separate spots of 200 µm in diameter, hybridization was conducted in the presence of one or other or of both biotinylated complementary strands and detection was performed using a fluorophore, SAPE (Streptavidin-R-Phycoerythrin), via avidin-biotin coupling (FIG. 1).

The operating mode was the following. After grafting each oligonucleotide-amine ZIP 6 and ZIP 9, the following steps were conducted:

Rinsing with PBS (Phosphate Buffer Saline solution containing 10 mM phosphate buffer, 0.137 M of NaCl and 2.7 mM of KCl, at pH 7.4) then with deionised water after grafting.

Depositing a solution of complementary DNA, 100 nm, in hybridization buffer (Denhart 1× solution, Sigma Aldrich®) for fifteen minutes at 42° C.

Rinsing with PBS.

Incubation in the presence of S.A.P.E (Molecular Probes®) at 0.1 mg/mL in PBS, for ten minutes in the dark.

Rinsing with PBS.

Detection by fluorescence.

The presence in the Denhart hybridization solution, which contains surfactants, of BSA (Bovine Serum Albumin) and of salmon sperm double strand DNA allows the blocking of a maximum number of non-specific absorption sites located on the diamond surface. Detection by SAPE no longer requires blocking of the surface owing to the prior use of the hybridization buffer.

Fluorescence contract was measured:
1) after hybridization with the biotinylated complementary of the ZIP6 probe,
2) then with the biotinylated complementary of ZIP 9, and
3) finally with the two complementaries simultaneously present in the hybridization solution.

Each of these three steps was conducted sequentially. After the first detection, the surface was denatured with 0.2 M sodium hydroxide for 1 min. The action of the sodium hydroxide allows breaking of the hydrogen bonds which ensure the maintaining of the double strand and allows surface release leaving only the grafted probe strands. The surface is then rinsed abundantly with water and then with a rinsing buffer (PBS) before performing a new detection with a second target strand in solution.

By adding strand complementary to the ZIP 6 probe (step 1) only the spot carrying the related ZIP6 probe is illuminated. The fluorescence contrast obtained between specific spot and non-specific spot (spot ZIP 9) is of the order of 8. This contrast is identical to the contrast calculated between hybridized region and non-modified region.

After denaturing and rinsing, the target complementary to the ZIP9 strand was injected into the hybridization solution (in the absence of ZIP6 complementary) (step 2). Only the ZIP9 spot was illuminated with similar fluorescence contrast.

Finally, after denaturing and rinsing, the two targets were simultaneously injected into the hybridization solution (step 3). On detection, the two spots were illuminated with similar fluorescence contrasts.

This experiment showed firstly the stability of grafting (no loss of fluorescence over 3 hybridization-denaturing cycles) and secondly and more especially the possibility of multiplexing biological data on one same substrate with excellent spatial resolution.

The invention claimed is:

1. A method for preparing a grafted material comprising the following steps:
   a) providing a material which, on its surface, comprises sp3 hybridized carbon, silicon and/or germanium atoms carrying at least one hydrogen atom, and
   b) contacting in a solvent the material provided at step a) with a compound (C) carrying at least one amine function in the unprotonated state, whereby the said compound (C) is grafted onto the said material,
   wherein the amine function is not the amine of an amide function.

2. The method according to claim 1, wherein step b) is conducted in the presence of oxygen.

3. The method according to claim 1, wherein step b) is conducted in the presence of water.

4. The method according to claim 1, wherein the material comprises at least one surface layer formed of one of the elements selected from among carbon, silicon, germanium and mixtures thereof.

5. The method according to claim 1, wherein the material provided at step a) is derived from a hydrogenation step of an initial material whose surface comprises sp3 hybridized carbon, silicon and/or germanium atoms, initially non-hydrogenated or not fully hydrogenated.

6. The method according to claim 5 wherein the material provided at step a) is derived from a hydrogenation step by H2 plasma of an initial material whose surface comprises diamond, silicon or germanium, initially non-hydrogenated or partly non-hydrogenated.

7. The method according to claim 5, wherein the material provided at step a) is derived from a hydrogenation step by treatment with hydrofluoric acid of an initial material whose surface comprises silicon or germanium initially non-hydrogenated or partly non-hydrogenated.

8. The method according to claim 1 wherein the material, on its surface, comprises synthetic diamond.

9. The method according to claim 1 wherein the amine function is a primary or secondary amine.

10. The method according to claims 1 wherein the compound (C) carrying the amine function is a functional molecule.

11. The method according to claims 1, wherein the grafting of the compound (C) is performed in localized manner on a determined part of the surface.

12. The method according to claim 8, wherein the material, on its surface, comprises freshly prepared synthetic diamond.

13. The method according to claim 12, wherein the material, on its surface, comprises synthetic diamond on leaving the growth apparatus of a vapour phase growth method (CVD).

14. The method according to claim 9, wherein the amine function is a primary amine.

15. The method according to claim 10, wherein the functional molecule is chosen from the group consisting of a fluorophore, a chromophore, a biological molecule, and an active molecule in the meaning of energy transfer.

16. The method according to claim 15, wherein the active molecule in the meaning of energy transfer is chosen from the group consisting of a metallic complex, a bioinorganic complex, and an organic, bioorganic, or organo-inorganic redox compound.

17. The method according to claim 15, wherein the biological molecule is selected from the group consisting of deoxyribonucleic acid (DNA), ribonucleic acid (RNA), a protein, a peptide, an enzyme, an antibody, and a carbohydrate.

18. The method according to claim 1, wherein the grafting of the compound (C) is performed by grafting the alpha carbon of the nitrogen of the compound (C) onto the material via the setting up of a covalent bond.

* * * * *